United States Patent
Garceran et al.

(10) Patent No.: US 6,944,238 B2
(45) Date of Patent: Sep. 13, 2005

(54) DIGITAL TRANSMITTER SYSTEM AND METHOD

(75) Inventors: Julio Antonio Garceran, Randolph, NJ (US); Walter Joseph Kaminski, Long Valley, NJ (US); Arild Kolsrud, Bridgewater, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 719 days.

(21) Appl. No.: 09/784,846

(22) Filed: Feb. 16, 2001

(65) Prior Publication Data

US 2002/0114403 A1 Aug. 22, 2002

(51) Int. Cl.[7] .......................... H04L 27/20; H04K 1/02
(52) U.S. Cl. ................... 375/295; 375/297; 375/146
(58) Field of Search ................... 375/146, 140, 375/295, 297, 296, 299; 341/144–154

(56) References Cited

U.S. PATENT DOCUMENTS

| | | | | |
|---|---|---|---|---|
| 3,987,280 A | | 10/1976 | Bauer | 235/150.53 |
| 4,855,894 A | * | 8/1989 | Asahi et al. | 363/157 |
| 5,047,705 A | * | 9/1991 | Kishi | 332/151 |
| 5,220,557 A | * | 6/1993 | Kelley | 370/345 |
| 5,924,031 A | * | 7/1999 | Copeland et al. | 455/428 |
| 6,507,303 B1 | * | 1/2003 | Alelyunas et al. | 341/144 |

FOREIGN PATENT DOCUMENTS

| | | | | |
|---|---|---|---|---|
| EP | 0 534 255 A2 | 3/1993 | | H04L/5/06 |
| EP | 0 817 369 A2 | 1/1998 | | H03D/7/00 |
| WO | WO 99 07093 A | 2/1999 | | H03D/7/00 |
| WO | WO 99 67878 A | 12/1999 | | H03D/7/00 |

OTHER PUBLICATIONS

Jerry D. Gibson, "The Communications Handbook"; 1997, CRC Press, pp. 107–116.*
Analog Devices, High Speed Design Techniques, Sep. 1996, pp. 6–25 to 6–30.
European Search Report dated May 13, 2002.

* cited by examiner

*Primary Examiner*—Chieh M. Fan
*Assistant Examiner*—Jason M. Perilla
(74) *Attorney, Agent, or Firm*—Julio A. Garceran; Martin I. Finston

(57) ABSTRACT

A digital transmitter converts a digital signal into analog form with a digital to analog converter (DAC) and uses an analog signal image produced from the DAC to provide an analog signal at a transmission frequency and/or uses a projected analog signal image to produce analog signals for transmission. Rather than removing analog signal images with a low pass filter at the output of the DAC and/or using analog signal images and analog mixers for frequency conversion, the digital transmitter uses the analog signal images from the DAC to produce the analog signals at the desired frequency/frequencies. By setting and/or adjusting the conversion rate for the DAC and/or the digital signal frequency/frequencies, the analog signal images produced from the DAC can be positioned in the desired frequency band(s). For example, the digital transmitter can position the digital signals within non-overlapping portions of a conversion bandwidth defined as one-half the conversion rate for the DAC. When the digital signals are converted into analog form, the DAC produces analog signal images periodically repeated at multiples of one-half the conversion rate such that analog signal images are produced at the appropriate frequency band(s) for amplification and transmission.

6 Claims, 8 Drawing Sheets

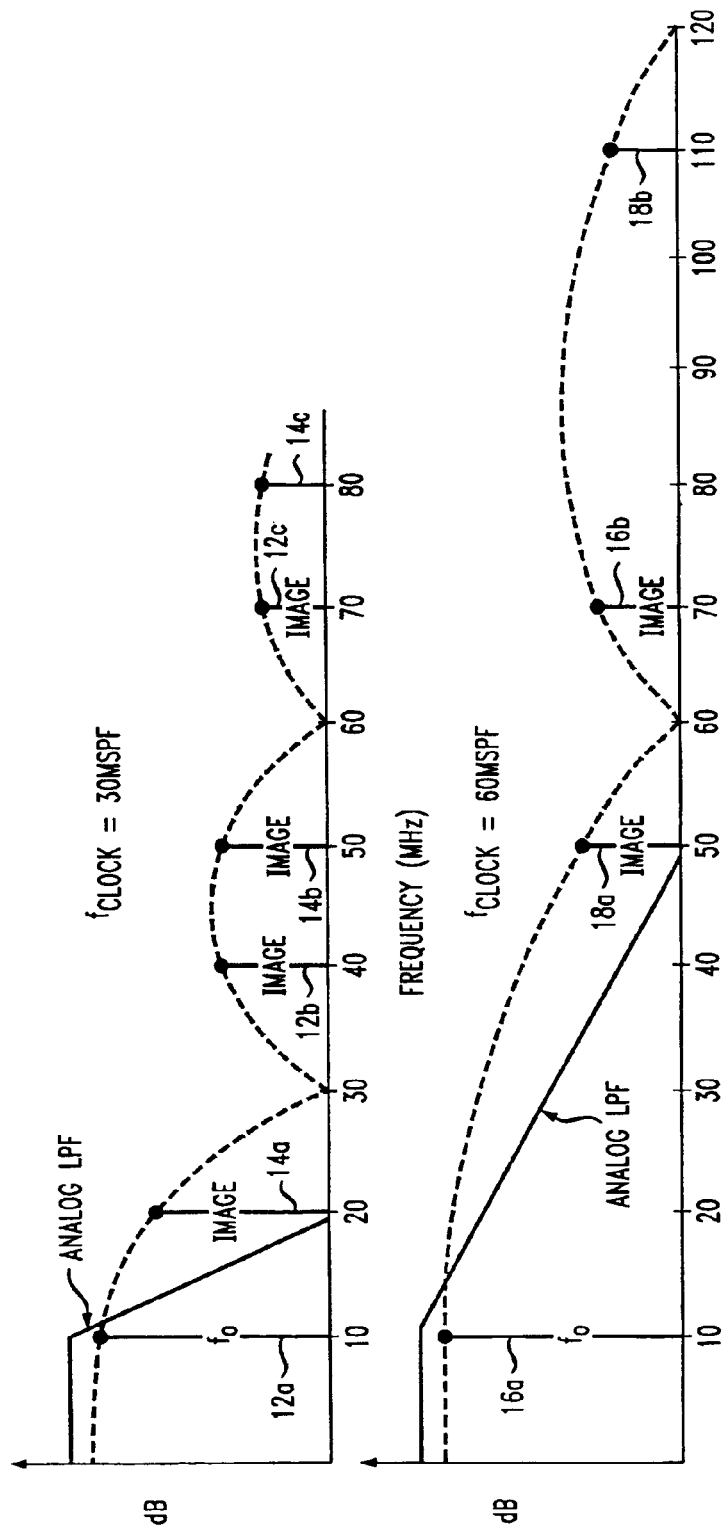

20

20

DIGITAL TRANSMITTER SYSTEM AND METHOD

BACKGROUND OF THE INVENTION

1. Field of the Invention

This invention relates to wireless communications and, more particularly, to a digital transmitter architecture for a wireless communications system.

2. Description of Related Art

The service area of a wireless communications system is partitioned into connected service domains known as cells, where wireless units communicate via radio links with a base station (BS) serving the cell. The base station is coupled to a land network, for example through a Mobile Switching Center (MSC) which is connected to a plurality of base stations dispersed throughout the service area. In the wireless communications industry, service providers are often granted two or more non-contiguous or segregated frequency bands to be used for the wireless transmission and reception of RF communications channels. For example, in the United States, a base station for an "A" band provider for cellular communications receives frequency channels within the A (825–835 MHz), A' (845–846.5 MHz) and A" (824–825 MHz) bands, and transmit on frequency channels within the A (870–880 MHz), A' (890–891.5 MHz) and A" (869–870 MHz) bands. A base station for a B band provider receives frequency channels within the B (835–845 MHz) and B' (846.5–849 MHz) frequency bands, and transmits on frequency channels within the B (880–890 MHz) and B' (891.5–894 MHz) frequency bands. Additionally, a base station for a Personal Communications Systems (PCS) provider may receive frequency channels from wireless units on one or more blocks of the PCS band (1850 MHz-1910 MHz), and transmit on frequency channels on one or more blocks of the PCS band (1930–1990 MHz).

In a typical transmitter architecture, the baseband information signals are digital signals which are provided to signal processing units (SPUs). The SPUs take the baseband digital signals and perform encoding, error detection processing, bit interleaving and digital in-phase (I) and quadrature (Q) modulation on the digital signals. The resulting digital (I/Q) modulated intermediate frequency (IF) signals are summed together and provided to a digital to analog converter (DAC). The DAC converts the digital IF signals into analog IF signals which are frequency upconverted using analog mixers into analog radio frequency (RF) signals for transmission at the appropriate frequency bands. A common transmitter for the simultaneous processing and transmission of signals within the non-contiguous frequency bands could reduce system hardware costs.

Currently, the transmission systems have an analog low pass filter to remove periodic images of the analog IF signals produced at higher frequencies by the DAC as a result of the digital to analog conversion process. When the digital IF spectrum is converted into the analog domain by a DAC at a conversion rate, the signal bandwidth rotates, or folds, periodically at multiples of one-half the conversion frequency. As such, replica and mirror images of the signal bandwidth are periodically repeated at frequency intervals corresponding to the conversion rate of the DAC.

For example, FIG. 1 shows the analog filter requirements for a DAC where the fundamental analog output frequency $f_0$=10 MHz, which corresponds to the digital input frequency of 10 MHz, and the conversion rate is 30 megawords per second (Mwps) or 30 megasamples per second (Msps), which is equivalent to a conversion frequency of 30 MHz, for the top graph and a conversion rate of 60 Mwps or 60 Msps, which is equivalent to a conversion frequency of 60 MHz, for the bottom graph. The DAC converts the 10 MHz digital signal to a fundamental analog signal image 12a at 10 MHz. With a conversion rate of 30 MHz, the DAC outputs a mirror image 14a at 20 MHz of the fundamental analog signal 12a. Because the signal bandwidth and mirror images of the signal bandwidth are periodically repeated at frequency intervals corresponding to the conversion rate, a replica image 12b of the analog signal is produced at 40 MHz, and a mirror image 14b is produced at 50 MHz along with a replica image 12c at 70 MHz and a mirror image 14c at 80 MHz. For a DAC with a conversion rate of 30 MHz, current design practices use an analog low pass filter (LPF) to remove any images 12b–c and 14a–c and so on from the output of the DAC, leaving the fundamental 10 MHz analog signal image for upconversion to the appropriate RF frequency for transmission.

With a conversion rate of 60 MHz (or 60 Msps or 60 Mwps), the DAC outputs the fundamental 10 MHz analog signal image 16a along with a mirror image 18a at 50 MHz. Because the signal bandwidth and mirror images of the signal bandwidth are periodically repeated at frequency intervals corresponding to the conversion rate, a replica image 16b of the analog signal is produced at 70 MHz, and a mirror image 18b is produced at 110 MHz. As described above, current design practices use an analog low pass filter (LPF) to remove any images 16b, 18a, 18b and so on from the output of the DAC, leaving the fundamental 10 MHz analog signal image for upconversion to the appropriate RF frequency for transmission.

As technology improves, the conversion rate for DACs increases. Current transmitter architectures, however, do not take advantage of the potential cost savings and flexibility which could be provided by the DACs.

SUMMARY OF THE INVENTION

The present invention is a digital transmitter which converts a digital signal into analog form with a digital to analog converter (DAC) and uses an analog signal image produced from the DAC to provide an analog signal at a transmission frequency and/or uses a projected analog signal image to produce analog signals for transmission. Rather than removing analog signal images with a low pass filter at the output of the DAC and/or using analog signal images and analog mixers for frequency conversion, the digital transmitter uses the analog signal images from the DAC to produce the analog signals at the desired frequency/frequencies. By setting and/or adjusting the conversion rate for the DAC and/or the digital signal frequency/frequencies, the analog signal images produced from the DAC can be positioned in the desired frequency band(s). For example, the digital transmitter can position the digital signals within non-overlapping portions of a conversion bandwidth defined as one-half the conversion rate for the DAC. When the digital signals are converted into analog form, the DAC produces analog signal images periodically repeated at multiples of one-half the conversion rate such that analog signal images are produced at the appropriate frequency band(s) for amplification and transmission.

BRIEF DESCRIPTION OF THE DRAWINGS

Other aspects and advantages of the present invention may become apparent upon reading the following detailed description and upon reference to the drawings in which:

FIG. 1 shows a general graph of how the prior art teaches to filter out analog signal images from the output of DACs;

FIG. 2b shows a graph of the output of the DAC for the transmitter of FIG. 2a;

DETAILED DESCRIPTION

Figure 2A:
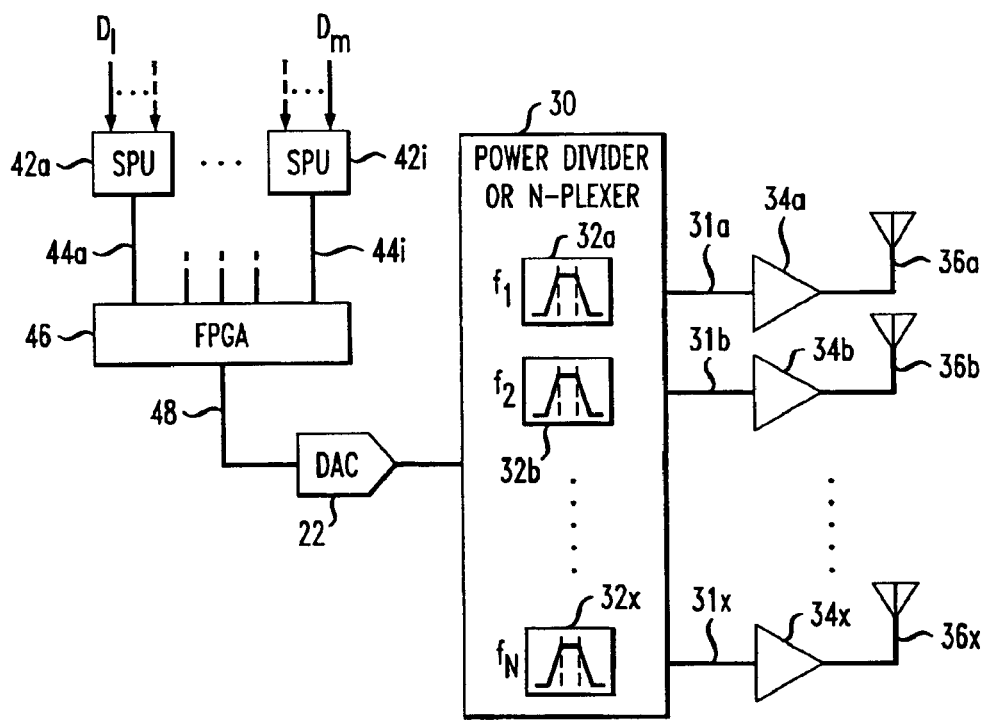
FIG. 2a shows a general block diagram of an embodiment of the transmitter according to the principles of the present invention.

Illustrative embodiments are described below of a digital transmitter system having a digital to analog converter (DAC) to convert a digital signal(s) into analog form and using resulting analog signal image(s) to produce analog signal(s) for transmission. FIG. 2a shows a digital transmitter 20 including a DAC 22 which receives at least one digital signal. The DAC 22 converts the digital signal spectrum at a conversion rate $f_c$. The conversion rate $f_c$ for the DAC is chosen such that the conversion bandwidth from 0 Hz to one-half of the conversion rate encompasses the bandwidth of the digital signal(s). The higher the conversion rate, the wider is the conversion bandwidth. If the digital signal bandwidth is greater than one-half the conversion rate, an undesirable overlapping between the projected images can occur.

Figure 2B:
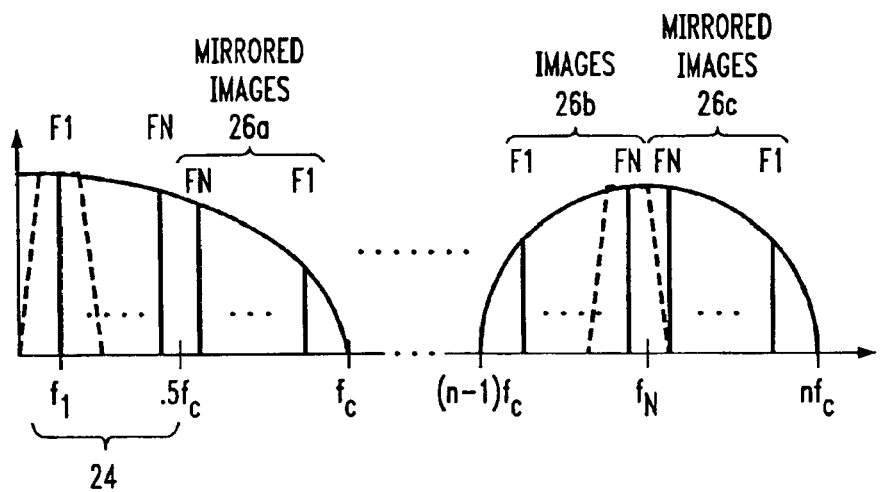

As shown in FIG. 2B, the DAC converts the digital signals (F1–FN) using a conversion rate $f_c$ encompassing the digital signals from frequencies F1 to FN within a conversion bandwidth equal to one-half the conversion rate. In converting the digital spectrum into analog form at the conversion rate $f_c$, the conversion bandwidth or fundamental analog image 24 rotates or folds periodically at multiples of one-half the conversion frequency $f_c$ to produce a mirrored first projected analog image 26a, a replica second projected analog image 26b and a mirrored third projected analog image 26c of the fundamental image 24 containing the analog signals (F1–FN). Analog image can refer to the fundamental analog image produced from 0 Hz to one-half the conversion rate by converting the digital spectrum into analog form at the conversion rate as well as any projected replica or mirrored analog images of the fundamental analog image. Analog signal image can refer to a fundamental analog signal image as well as the corresponding projected analog signal images of the fundamental analog signal image resulting from converting a particular digital signal(s) within the digital signal spectrum into analog form.

By setting the conversion rate and/or the digital signal frequencies, the converted digital signals can be positioned at frequencies such that when the digital signals are converted into analog form, the analog signal images fall at the desired frequencies. If the fundamental analog signal image is at the desired transmission frequency, the fundamental analog signal image can be directly amplified and transmitted at the desired transmission frequency without frequency conversion in the analog domain. If the fundamental analog signal image is not at the desired transmission frequency, the digital transmitter can use the subsequent analog signal images which are projected from the fundamental analog signal image to produce the desired analog signal for transmission. As such, rather than filtering the analog signal images from the fundamental analog signal image, a projected analog signal image which falls on a desired transmission frequency can be directly amplified and transmitted. The projected analog signal image could also fall on a desired intermediate frequency (IF) which can be frequency converted to an intermediate or eventually a transmission frequency for amplification and transmission. By using a projected analog signal image at a desired intermediate frequency, the number of frequency conversion stages can be reduced. Projected analog signal images refers to a replica or mirror image of the fundamental analog signal image. Thus, the digital transmitter does not need to filter out the analog images nor rely only on frequency conversion in the analog domain to position the analog signals in the appropriate transmission band(s).

The digital transmitter provides flexibility and efficient use of the available conversion bandwidth established by the conversion rate. For example, if the digital signals that are converted into analog form are to be transmitted in non-contiguous frequency bands, the conversion bandwidth could encompass the non-contiguous bands if a high enough conversion rate is available. If not or if desired, the digital transmitter can position the digital signals within the conversion bandwidth at positions independent of the relative positioning between the corresponding analog signals at the transmission frequencies. For example, the digital signals can be positioned closer together in the conversion bandwidth than the corresponding analog signals at their transmission frequencies. After the digital transmitter converts the digital signals into analog form, analog signal images in different zones (or different multiples of one-half the conversion rate) can be used to produce analog signals in the non-contiguous transmission bands.

Alternatively, a digital transmitter may be able to communicate on a plurality of wireless communications frequencies, such as PCS or cellular, and/or using a plurality of wireless communications protocols, such as CDMA, GSM, North American TDMA or others. As such, depending on the wireless communications frequency(ies) and/or wireless communication protocol(s) to be used by the digital transmitter (base station or wireless unit), the conversion rate to be used can be set and/or the position of the digital signal(s) adjusted such that the resulting analog signal image falls on the desired transmission frequency(ies). Moreover, when a wireless unit attempts to access a wireless communications system, the wireless unit may not have information on the type of wireless communication frequency/frequencies and/or protocol(s) used in the system, or the system could use a plurality of non-contiguous frequency band and/or protocols.

To access and communicate with the wireless communication system, the wireless unit could set the digital signal frequencies and/or conversion rate to transmit analog signals simultaneously using different frequency bands and/or protocols. The wireless unit could transmit using one frequency band/protocol combination at a time for analog signal transmissions, for example by changing the conversion rate and/or digital signal frequency(ies) for each analog signal transmissions corresponding to at least each different frequency band. The digital signal frequency(ies) and/or conversion rates for the desired type of analog signal transmission could be, predetermined and set for a single frequency band/protocol configuration, predetermined and stored for a plurality of frequency/protocol configurations and/or determined or calculated in the wireless unit or base station or received from the wireless unit or the wireless communications system depending on the embodiment. Configuration settings could also include amplifier bias and/or predistortion settings.

In the embodiment of FIG. 2a, a coupling network or signal distribution network 30, such as a power divider or a N-plexer, receives the entire analog signal spectrum from the DAC 22 and combines and/or separates the analog signals or portions thereof and provides the analog signals onto transmission, amplification or channel branches or paths 31a–x in a desired manner. For example, the paths 31a–x can carry the analog signals for corresponding RF frequency bands, can carry analog signals to be transmitted on different antenna(s) or sets of antennas, and/or can have copies of the analog signals of different or contiguous frequency bands. Depending on the embodiment, the coupling network 30 can simply include direct connection(s) from the DAC 22 to each filter 32a–x, and each filter 32a–x is connected to a corresponding antenna 36a–x. If the transmitter 20 has a single transmission branch 31, the coupling network 30 includes a connection from the DAC 22 through a filter 32, an amplifier 34 to an antenna 36. The numbers of paths 31a–x, filters 32a–x, amplifiers 34a–x and antennas 36a–x can be equal to or greater than one and can be different and/or equal to each other.

In any event, the coupling network 30 provides the desired analog signals f1 to fN to paths 31a–x for amplification and transmission. In the embodiment of FIG. 2a, bandpass filters 32a–32x of the coupling network 30 allow the analog signals at the desired frequencies f1 to fN to pass on the corresponding path 31a–x while attenuating all other signal frequencies. The desired analog signals f1 to fN are amplified by amplifiers 34a–x and transmitted by antennas 36a–x. As shown in FIG. 2b, the desired frequencies f1–fN for the analog signals are at different portions of the analog signal spectrum. For example, the analog signal f1 for amplification and transmission is actually in a portion of the analog signal bandwidth (F1–FN) in the conversion bandwidth or fundamental analog image between 0 Hz and $0.5f_c$. The analog signal fN is in a portion of the replica image 26b of the n−1 multiple of the conversion rate $f_c$. After the analog signals are isolated at the desired frequencies (f1–fN), the amplifiers 34a–x amplify the analog signals at the desired frequencies for transmission through the antennas 36a–x.

In the embodiment of FIG. 2a, the transmitter 20 includes signal processing units (SPUs) 42a–i which receive m digital signals or streams $D_1$ to $D_m$, such as baseband digital information signals. An SPU can receive a single digital signal, a plurality of digital signals and/or a composite digital signal which includes a plurality of digital signals. In this embodiment, each SPU 42a–i receives at least one digital signal. If an SPU 42a–i receives a digital signal comprising a plurality of digital signals (such as digital baseband information signals for 10 voice calls at 8–10 kilobits per second), the digital signals are added together. Each SPU 42a–i can encode the digital signal(s), add error correction information to the digital signal(s), perform bit interleaving, and perform in-phase (I) and quadrature (Q) modulation on the digital signal(s) and perform digital frequency conversion (up or down) to produce a digital intermediate frequency (IF) signal. If the position of the digital signal(s) within the conversion bandwidth needs to be adjusted, a digital frequency converter, for example using a numerically controlled oscillator (NCO) and digital mixer for frequency spectrum positioning, can tune the baseband digital signal(s) or the digital IF signal for proper positioning of the digital signal(s) within the conversion bandwidth for the DAC such that the resulting analog image falls within the desired frequency band at the output of the DAC 22.

In the embodiment of FIG. 2a, an SPU 42a–i produces a digital I/Q modulated signal (digital intermediate frequency (IF)), resulting from the processing of at least one digital signal, onto corresponding buses 44a–i. The buses 44a–i are provided to a combiner 46, such as a field programmable gate array FPGA acting as a bus summer. The combiner 46 aligns the clock and data edges of the digital signals from the different buses 44a–i and sums the digital signals on the buses 44a–i onto a bus 48. In one example, each bus 44a–i is an 18 bit bus handling 68 megawords per second (Mwps) of digital data, where a word is the width of the bus, and the bus 48 is a 14 bit bus handling 68 Mwps. If there are five SPU's 48a–i, and each SPU 44a–i handles up to 10 voice calls, the bus 48 can carry a digital signal for up to 50 voice calls. The bus 48 provides the composite digital signal to the DAC 22, which can be a 14 bit DAC performing at a conversion rate of 68 MHz. In this example, due to the fact that the DAC is a 14 bit device and each bus 44 a–i to be summed is 18 bits (with sign bits), the FPGA 46 does a truncation on the resulting sum of the incoming buses 44a–i. This truncation is usually referred to as a gain adjustment.

As mentioned above, a conversion rate for the DAC 22 is selected such that the total bandwidth of the digital information signals is encompassed by the conversion bandwidth which is at least one-half the conversion rate or frequency. Additionally, the different digital signals should occupy non-overlapping portions of the conversion bandwidth which fold out to produce analog signal image(s) at the desired frequency bands for each of the corresponding digital signals. The analog signal images at the desired frequency bands can be used to produce analog signals for transmission at RF.

Figure 3:
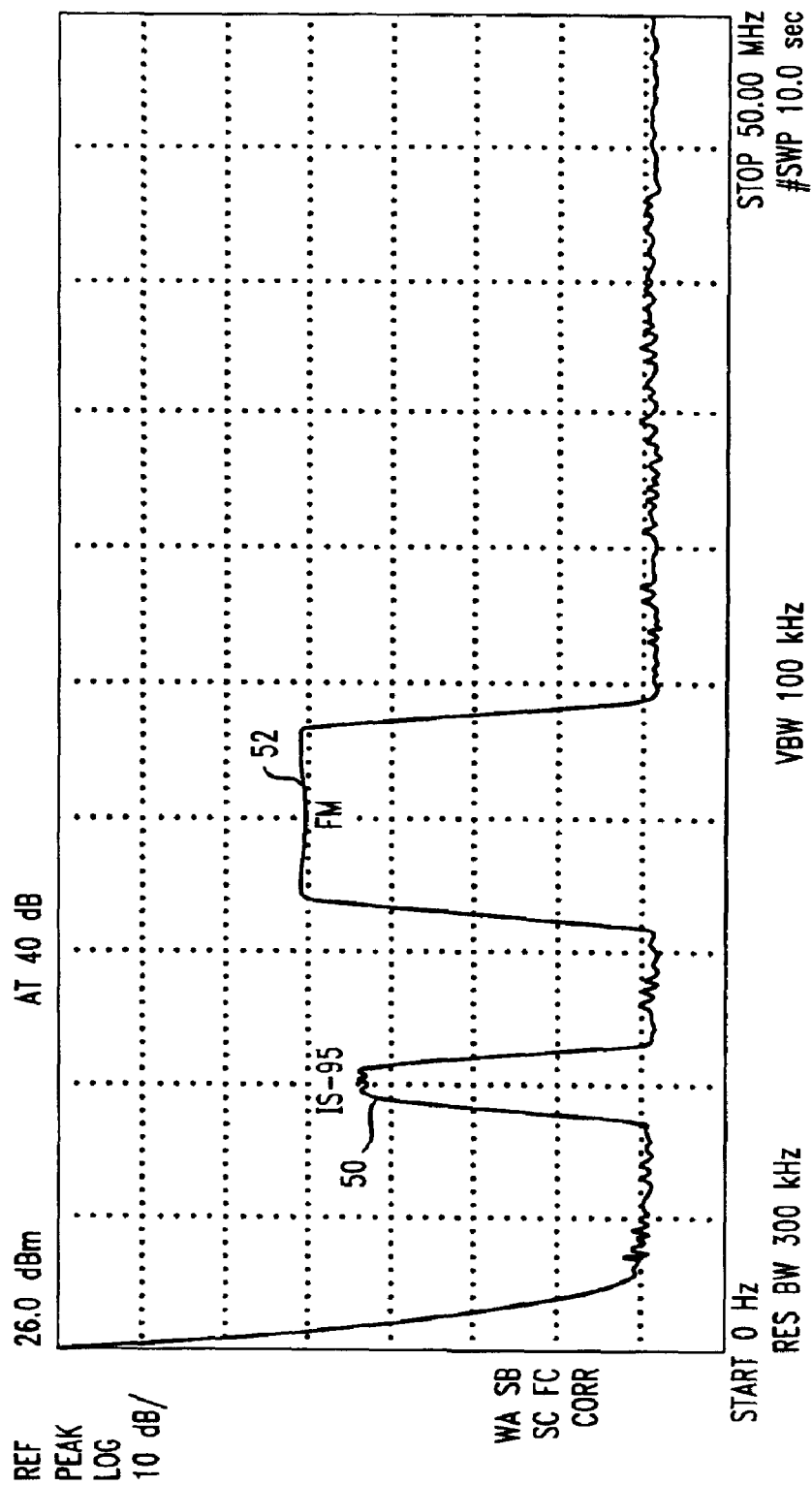
FIG. 3 shows a frequency domain graph of example digital signals to be converted into analog form and transmitted according to principles of the present invention.

FIG. 3 shows a frequency spectrum analysis from 0 Hz to 50 MHz of a composite digital signal. The graph can be obtained by performing a fourier transform on the composite digital signal as would be understood by one of skill in the art. The composite digital signal, which itself can be referred to as a digital signal, comprises a code division multiple access (CDMA) digital signal 50 at a center frequency of 10 MHz with about a 2 MHz bandwidth and an amplitude of about −10 dBm and a frequency modulated (FM) digital signal 52 at a center frequency of 20 MHz with about 7 MHz bandwidth and an amplitude of −4 dBm. The composite digital signal is provided to a DAC for conversion into analog form.

Figure 4:
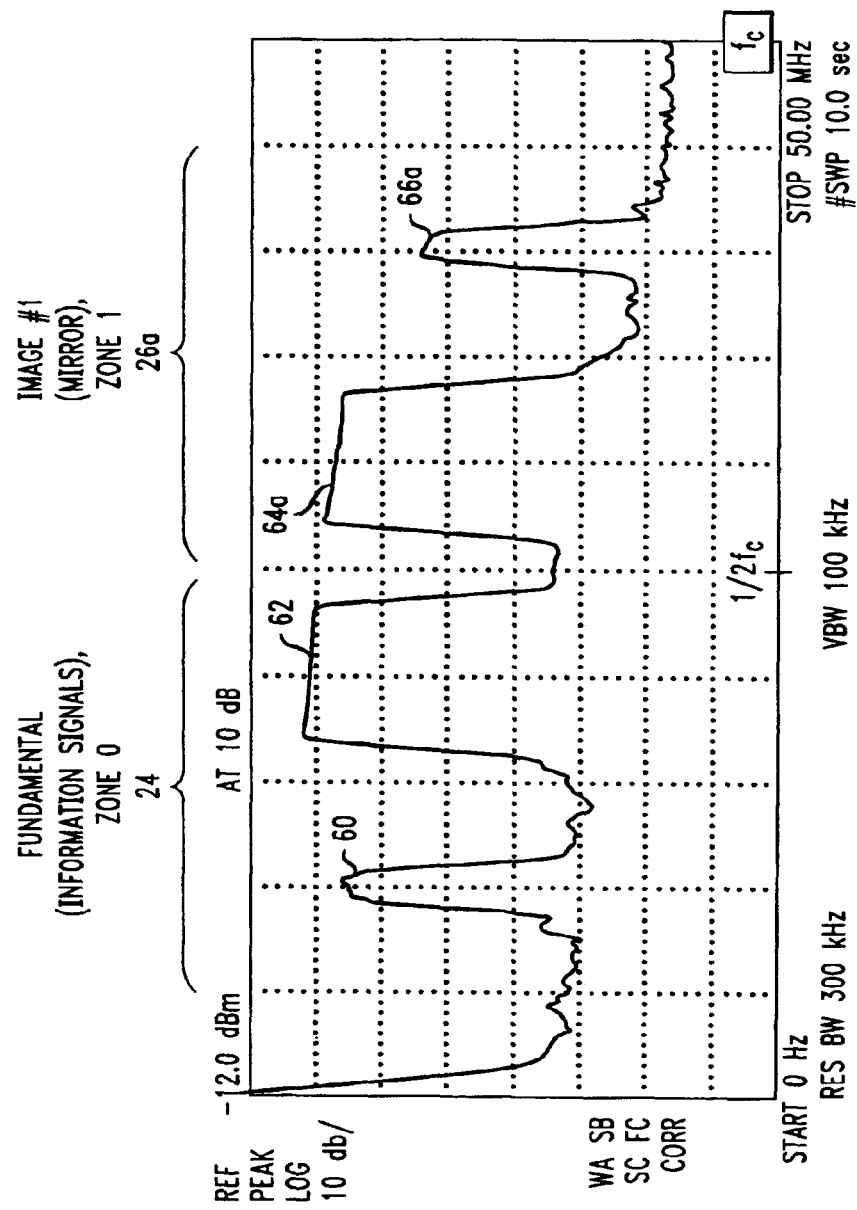
FIG. 4 shows the analog signal images in a span of 0 to 50 MHz at the output of the DAC resulting from the conversion of the digital signals of FIG. 3 into analog form using a conversion frequency of 50 MHz.

FIG. 4 shows a frequency spectrum analysis from 0 to 50 MHz of the output of the DAC resulting from the composite digital signal of FIG. 3 with the DAC operating at a conversion rate or frequency $f_c$ of 50 MHz. From 0 Hz to one-half $f_c$, which can be referred to as the conversion bandwidth or zone 0, the fundamental analog signal images 60 and 62 appear as result of the digital to analog conversion of the composite digital signals 50 and 52 (FIG. 3). As such, the fundamental analog signal image 60 corresponds to CDMA digital signal 50 of FIG. 3, and the fundamental analog signal image 62 corresponds to the FM digital signal 62 of FIG. 3. As shown, the analog signal image 60 remains at a center frequency of about 10 MHz with a bandwidth of about 2 MHz while the amplitude is at about −26 dBm. The analog signal image 62 remains at a center frequency of about 20 MHz with a bandwidth of about 7 MHz while the amplitude is at about −22 dBm.

As mentioned above, the spectrum within the conversion bandwidth folds up about intervals of ½ the conversion rate to produce projected replica and mirror analog images of the fundamental image. In FIG. 4, the conversion bandwidth or zone 0 folds about 25 MHz (one-half the conversion rate) to produce a mirrored analog image 26a of the fundamental analog image 24 from about 25 MHz to 50 MHz which can be referred to as zone 1. In zone 1, analog signal image 64a is the mirror image of the FM analog signal image 62. The analog signal image 64a has a center frequency of about 30 MHz with the bandwidth remaining at about 7 MHz while the amplitude is at about −25 dBm. Analog signal image 66a is the mirror image of the CDMA analog signal image 60. The analog signal image 66a has a center frequency of 40 MHz with the bandwidth remaining at about 2 MHz while the amplitude is at about −38 dBm. Amplitude differences between figures can result from setting changes on the spectrum analyzer between the figures, such as the resolution bandwidth, video bandwidth (VBW), sweep rate, span and start/stop. The setting changes may effect the resolution and accuracy of the spectrum analyzer.

Figure 5:
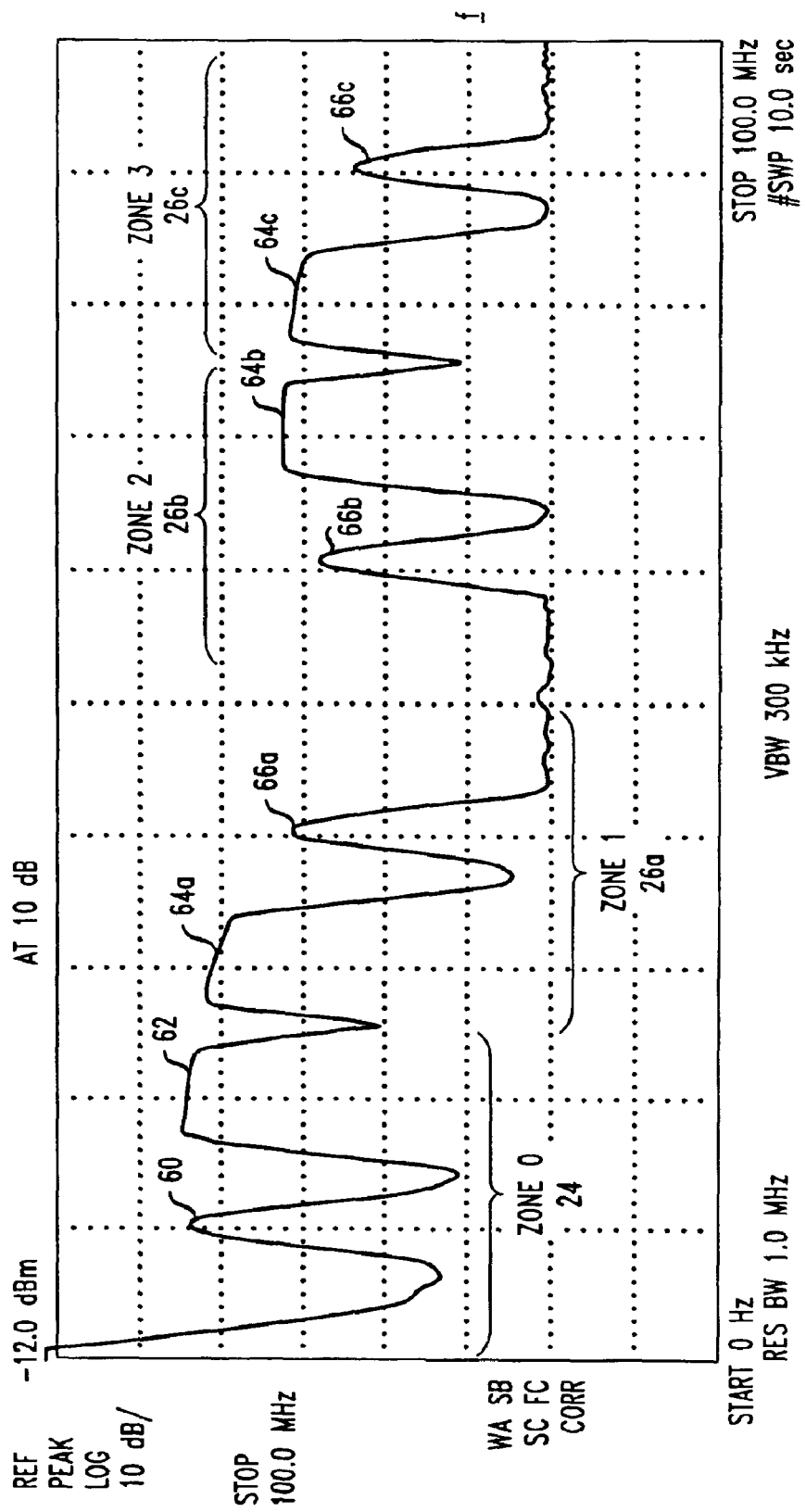
FIG. 5 shows the analog signal images in a span of 0 to 100 MHz at the output of the DAC resulting from the conversion of the digital signals of FIG. 3 into analog form using a conversion frequency of 50 MHz.

FIG. 5 shows a graph of the frequency spectrum from 0 to 100 MHz with the spectrum analyzer set at a higher sensitivity. As mentioned above, replica and mirror projected analog images of the conversion bandwidth 24 or zone 0 (fundamental analog image) containing the fundamental analog signal image(s) are repeated at frequency intervals of the conversion frequency. In FIG. 5, zone 1 is a mirrored first projected analog image 26a of the fundamental analog image or zone 0; zone 2 is a replica second projected analog image 26b of the fundamental analog image or zone 0; and zone 3 is a mirrored third projected analog image 26c of the fundamental analog image or zone 0. As such, analog signal image 66b in zone 2 is a replica of CDMA analog signal image 60, and analog signal image 64b in zone 2 is a replica of FM analog signal image 62. The CDMA analog signal image 66b is at a center frequency of about 60 MHz with the bandwidth remaining the same and the amplitude about 15 dB less. The FM analog signal image 64b is at a center frequency of about 70 MHz with the bandwidth remaining the same and the amplitude about 12 dB less. In zone 3, the analog signal image 66c in zone 3 is a mirror image of CDMA analog signal image 60, and analog signal image 64c in zone 3 is a mirror image of FM analog signal image 62. The FM analog signal image 64c is at center frequency of about 80 MHz with the bandwidth remaining the same and the amplitude about 1 dB less than the FM analog signal image 64b in zone 2. The CDMA analog signal image 66c is at a center frequency of about 90 MHz with the bandwidth remaining the same and the amplitude about 4 dB less than the CDMA analog signal image 66b in zone 2.

Figure 6:
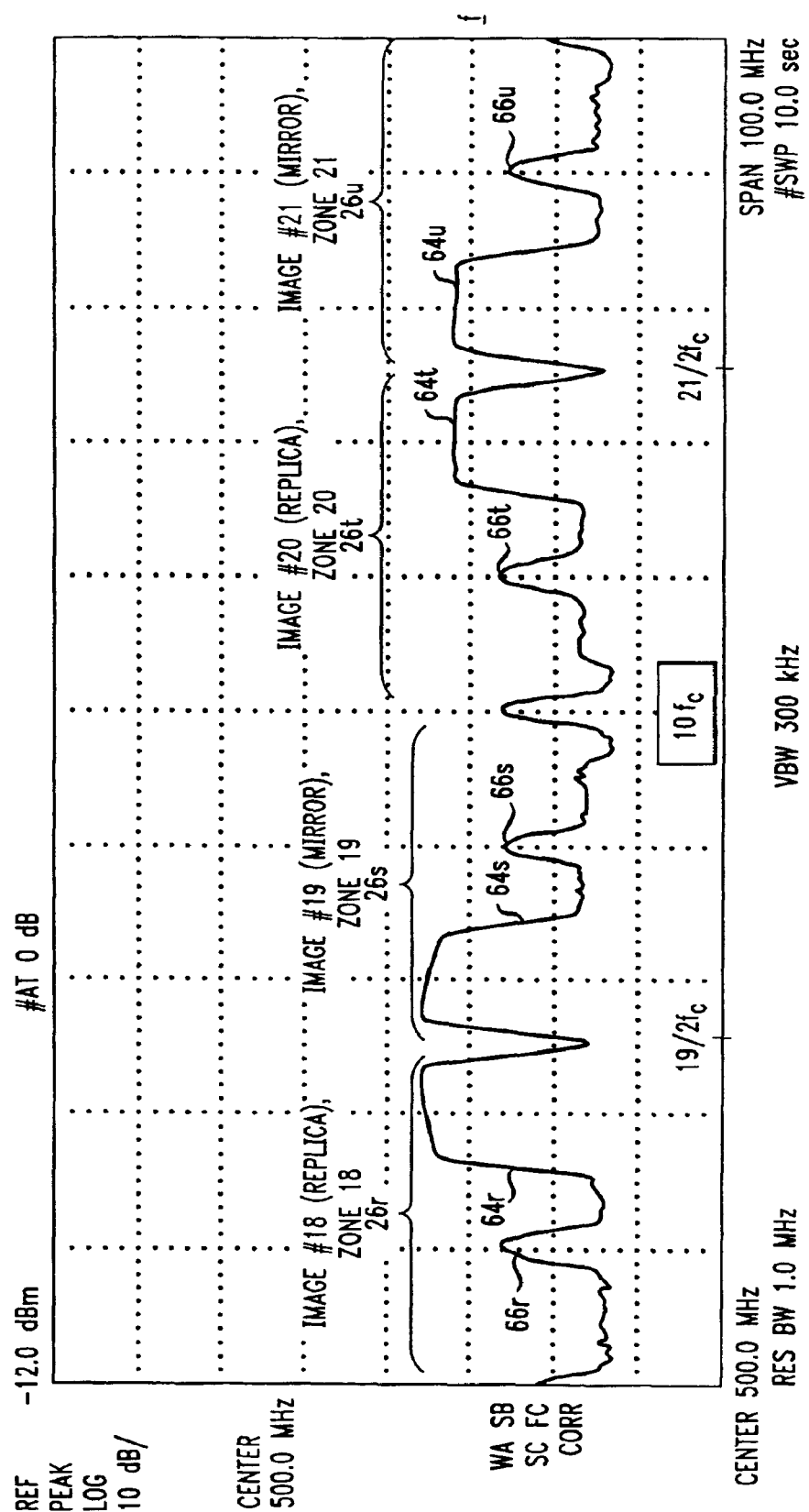
FIG. 6 shows the analog signal images in a span of 450 to 550 MHz at the output of the DAC resulting from the conversion of the digital signals of FIG. 3 into analog form using a conversion frequency of 50 MHz.

FIG. 6 is a graph showing the frequency spectrum from 450 MHz to 550 MHz containing projected analog images 26r–u. In FIG. 6, projected analog image 26r is the eighteenth ($18^{th}$) projected image or zone 18 of the fundamental analog image or zone 0. The analog image 26r or zone 18 is a replica of the fundamental analog image or zone 0. CDMA analog signal image 66r is a replica of the CDMA analog signal image 60 (FIG. 5), and FM analog signal image 64r is a replica of the FM analog signal image 62 (FIG. 5). The CDMA analog signal image 66r has a center frequency of about 460 MHz and has an amplitude which is shown as about 39 dB below the amplitude of the CDMA analog signal 60 (FIG. 5). The FM analog signal image 64r has a center frequency of about 470 MHz and has an amplitude which is shown as about 29 dB less than the amplitude of the FM analog signal 62 (FIG. 5).

The analog image 26s is the nineteenth ($19^{th}$) projected analog image or zone 19 of the fundamental analog image or zone 0. The analog image 26s or zone 19 is a mirror image of the fundamental analog image or zone 0. CDMA analog signal image 66s is a mirror image of the CDMA analog signal image 60 (FIG. 5), and FM analog signal image 64s is a mirror image of the FM analog signal image 62 (FIG. 5). The CDMA analog signal image 66s has a center frequency of about 490 MHz and has an amplitude which is shown as slightly less than the amplitude of the CDMA analog signal image 66r. The FM analog signal image 64s has a center frequency of about 480 MHz and has an amplitude which is shown as about 1 dB less than the amplitude of the FM analog signal image 64r.

The projected analog image 26t is the twentieth ($20^{th}$) image or zone 20 of the fundamental image or zone 0. The projected analog image 26t or zone 20 is a replica of the fundamental analog image or zone 0 where CDMA analog signal image 66t is a replica of the CDMA analog signal image 60 (FIG. 5), and FM analog signal image 64t is a replica of the FM analog signal 62 (FIG. 5). The CDMA analog signal image 66t has a center frequency of about 510 MHz and has an amplitude which is shown as about the same as the CDMA analog signal image 66s. The FM analog signal image 64t has a center frequency of about 520 MHz and has an amplitude which is shown as about 3 dB less than the amplitude of the FM analog signal image 64s.

Finally, the projected analog image 26u is the twenty first (21st) projected analog image or zone 21 of the fundamental analog image or zone 0. The analog image 26u or zone 21 is a mirror image of the fundamental analog image or zone 0. CDMA analog signal image 66u is a mirror image of the CDMA analog signal image 60 (FIG. 5), and FM analog signal image 64u is a mirror image of the FM analog signal image 62 (FIG. 5). The CDMA analog signal image 66u has a center frequency of about 540 MHz and has an amplitude which is shown as slightly less than amplitude of the CDMA analog signal image 66t. The FM analog signal image 64u has a center frequency of about 530 MHz and has an amplitude which is shown as about the same as the amplitude of the FM analog signal image 64t.

As the analog signal images increase in frequency, the amplitudes for the analog signal images decrease, but a low cost amplifier and/or amplifier stages together with any appropriate filtering can be used to amplify the analog signal images while maintaining the noise floor low as would be understood by one of ordinary skill in the art, for example by using band-limiting filtering to maintain the signal to noise ratio (SNR). Additionally, amplitude equalization filtering in the digital or analog domain can be used to compensate for any amplitude reduction and/or distortion produced by the DAC on the analog signal image, for example filtering implementing an inverse of a sin x/x function or other function to compensate for a sin x/x or other effect introduced by the DAC onto the analog signal images at the desired frequencies for the analog signal images.

Figure 7:
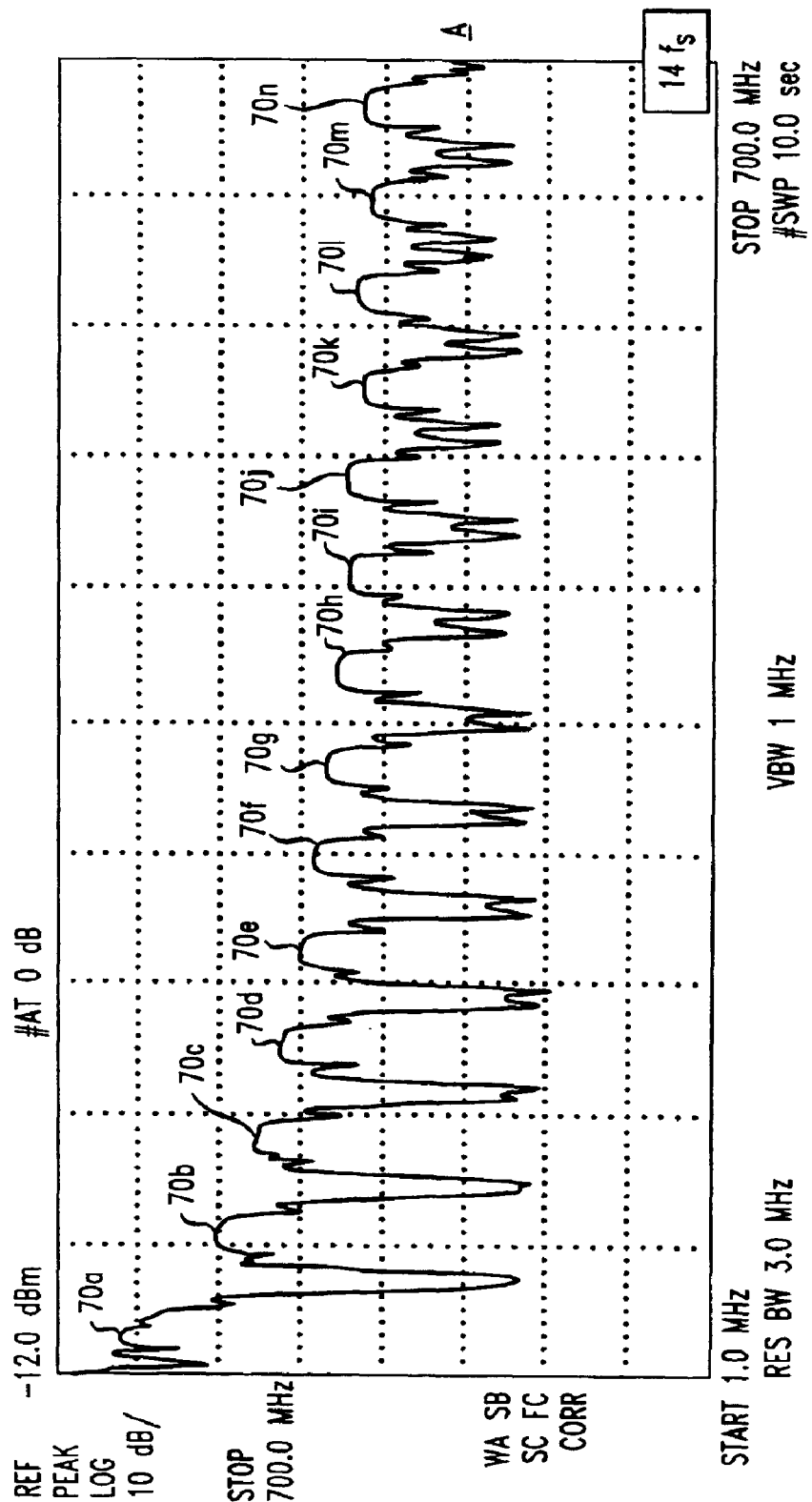
FIG. 7 shows the analog signal images in a span of 0 to 700 MHz at the output of the DAC resulting from the conversion of the digital signals of FIG. 3 into analog form using a conversion frequency of 50 MHz.

FIG. 7 shows a graph of the DAC output across 700 MHz of frequency spectrum from 1 MHz to 700 MHz. As mentioned above, each interval 70*a*–*n* of the conversion rate or frequency includes a replica analog image (the fundamental analog image itself in interval 70*a*) and a mirror analog image of the fundamental analog image in zone 0. The analog images do not appear as in the examples above due to the limitations in the resolution of the spectrum analyzer across such a wide frequency span. FIG. 7 shows how the amplitude of the analog signal images decrease in amplitude with increasing frequency. In this example, the analog signal images decrease about 30 dB from the frequency interval 70*a* to the frequency interval 70*n*, following a sin x/x or sin function deterioration in the amplitude of the analog images.

Thus, a digital transmitter according to the principles of the present invention could reduce or remove any frequency conversion stages and remove a low pass filter at the output of the DAC by using analog signal image(s) at the desired frequency(ies) to produce analog signals at baseband, intermediate frequency (IF) and/or radio frequency (RF) for transmission. Additionally, depending on the conversion rate used for the DAC, different digital signals can be positioned within non-overlapping portions of the conversion bandwidth, and the different analog signal images or portions thereof at different analog baseband, IF and/or RF frequency signals can be used for transmitting the analog signals. For example, in the example above, the FM analog signal image from a first zone can be used to transmit the FM analog signal at RF, and the CDMA analog signal image from a second zone can be used to transmit the CDMA analog signal image over the air at RF. Therefore, the digital transmitter 20 (FIG. 2) can use the conversion bandwidth available in a single DAC to produce the RF analog signals from different RF frequency bands.

Depending on the embodiment and due to the flexibility of the digital transmitter according to the principles of the present invention, the transmitter can be implemented in different ways to use the potential conversion bandwidth of a DAC 22 (FIG. 2*a*). For example, for a B band service provider, digital signals for communications to be transmitted over the cellular base station transmit "B" and B' band (880–890 and 891.5–894 MHz) could be positioned in a total 14 MHz portion (if the relationship between the B and B' bands at RF is maintained in the B and B' bands in the digital domain) of the conversion bandwidth of the DAC 22 such that the resulting cellular analog signal bandwidth in zone 0 folds out to the cellular base station transmit band at 880–894 MHz. Digital signals for communications over a "D block" of the PCS base station transmit band (1945–1950 MHz) could be positioned within a 5 MHz portion of the conversion bandwidth which does not overlap with the cellular band such that the resulting PCS analog signal bandwidth in zone 0 folds out to the D block of the PCS base station transmit band at 1945–1950 MHz). Additionally, in this example, digital signal information to be transmitted in the FM radio frequency band (88 to 108 MHz) could be positioned in a 20 MHz portion of the conversion bandwidth of the DAC 22 such that the resulting FM radio analog signal bandwidth is at or folds out to the FM radio band at 88 to 108 MHz.

In this example, the total bandwidth of the RF analog signals in the different portions of the conversion bandwidth is 39 MHz after adding the cellular (14 MHz), the D block for PCS (5 MHz) bands and the FM radio (20 MHz). As such, a conversion rate for the DAC 22 is used such that the conversion bandwidth is sufficient to handle the 39 MHz bandwidth of the RF analog signals. For example, at a bare minimum for 39 MHz of bandwidth, the conversion rate must be at least 78 MHz. Additionally, as would be understood by one of skill in the art with the benefit of this disclosure, the conversion rate for the DAC 22 is selected such that the different frequency bands are replicated in the desired frequency bands. As such, the selection of the appropriate conversion rate is effected by the relative positioning of the different frequency bands from the conversion bandwidth to the desired frequency bands for the analog images. In practice, a conversion rate is selected to provide guard bands between the signals of the different frequency bands.

Figure 8:
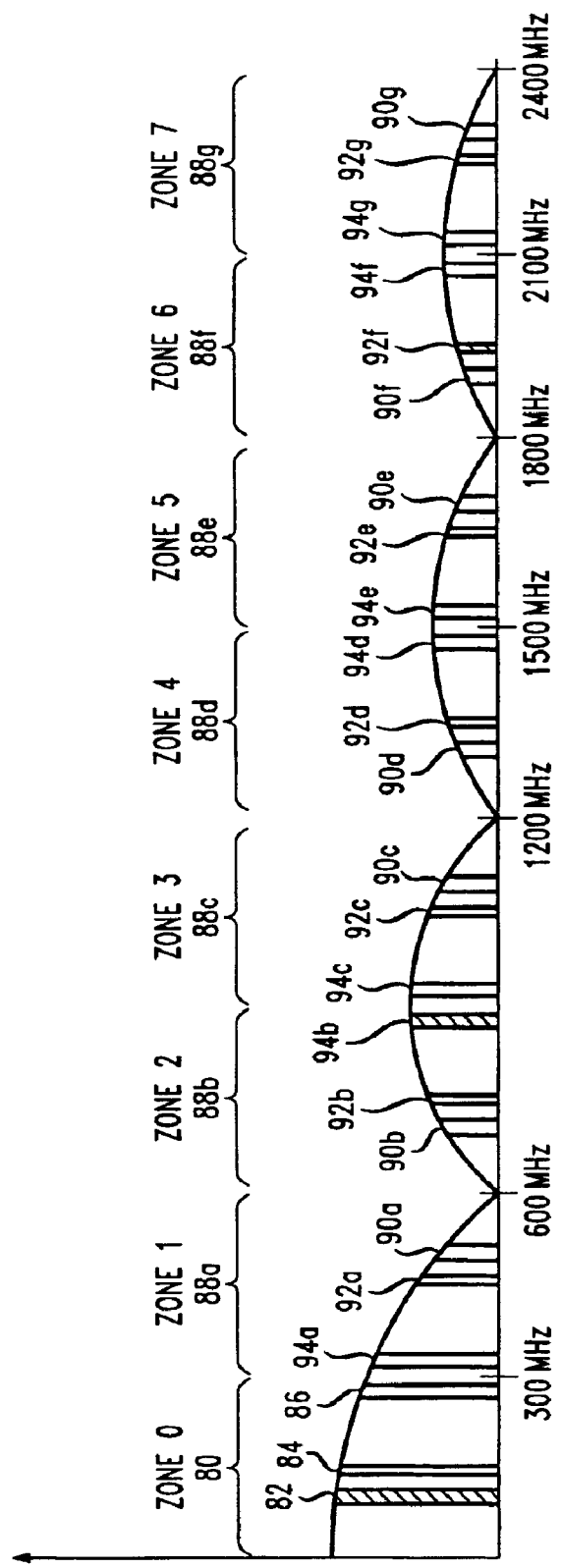
FIG. 8 shows the analog signal images in a span of 0 to 2400 MHz at the output of the DAC resulting from the conversion of example PCS, cellular and FM digital signals into analog form using a conversion frequency of 600 MHz

In an illustrative example, FIG. 8 shows the resulting DAC output if the DAC has a conversion rate of 600 MHz with a corresponding conversion bandwidth of 300 MHz. Within the conversion bandwidth, the FM digital signal bandwidth can be positioned at 88 to 108 MHz, the PCS D block digital bandwidth at 145–150 MHz and the cellular B band digital bandwidth at 280–294 MHz. The DAC converts the digital spectrum in analog form resulting in a fundamental image 80 within the conversion bandwidth with fundamental analog signal image 82 at 88 to 108 MHz (FM), fundamental analog signal image 84 at 145–150 MHz (PCS D-block) and fundamental analog signal image 86 at 280–294 MHz. The conversion bandwidth folds about itself at intervals of one-half the conversion rate to produce analog images or zones 88*a*–*g*. The fundamental FM analog signal image 82 is at the appropriate frequency for transmission. As such the digital transmitter can use the fundamental FM analog signal image 82 for transmission over the air at 88 to 108 MHz. Within odd numbered zones 88 *a*, *c*, *e* and *g*, mirror images of zone 0 (80) are created while, in even-numbered zones 88 *b*, *d*, and *f*, replica images of zone 0 are created. As such, in the zones 88*a*–*g*, the output of the DAC includes FM analog signal images 90*a*–*g* which will not be used in this example. The mirroring/de-mirroring of signal bandwidth can be readily performed, for example by swapping in-phase (I) and quadrature (Q) components prior to or during conversion into the digital domain such that the mirrored analog signal images for transmission have the desired spectral relationship. The desired spectral relationship for mirrored analog signal images can be achieved by manipulating the digital signal(s) as would be understood by one of skill in the art such that the resulting mirrored analog signal images for transmission have the desired spectral position (e.g. de-mirrored). Alternatively, the receiver could receive the mirrored analog signal images and perform the de-mirroring or folding of the spectrum to achieve the desired analog signal images.

Since the fundamental analog signal image 82 is at the transmission frequency of 88 to 108 MHz, the digital transmitter can use the fundamental FM analog signal image at 88 to 108 MHz for amplification and transmission. The cellular B-band analog signal image 94*b* falls on the transmission frequency of 880 to 894 MHz for the cellular B band, and the analog signal image 94*b* can be amplified and transmitted into the cellular B band. The PCS D-block analog signal image 92*f* falls on the transmission frequency of 1945–1950 MHz for the PCS D-block, and the analog signal image 92*f* can be amplified and transmitted into the PCS D-block.

With particular reference to the embodiment of FIG. 2*a* and the example of FIG. 8, the output of the DAC 22 is received by the coupling network 30 in which a bandpass filter 32*a* could correspond to the FM broadcast band of 88 to 108 MHz. As such, the filter 32*a* allows the frequencies between 88 and 108 MHz to pass onto the path 31a while attenuating other frequencies. The FM analog signal image 82 on the path 31a is amplified by the amplifier 34a and transmitted from antenna 36a. The bandpass filter 32b could correspond to the cellular B-band frequency or portion thereof and allow frequencies between 880–894 MHz to pass onto the path 31b while attenuating other frequencies. The cellular B-band analog signal image 94b on the path 31b is amplified by the amplifier 34b and transmitted from the antenna 36b. Finally, the bandpass filter 32x could correspond to the PCS D-block of frequency or portion thereof and allow frequencies between 1945–1950 MHz to pass onto the path 31y while attenuating other frequencies. The PCS D-block analog signal image 92f on the path 31y is amplified by the amplifier 34y and transmitted from the antenna 36z.

As such, in this embodiment, the transmitter according to principles of the present invention eliminates the need for a frequency conversion stage (mixer/LO combination) on any of the paths 31a–x (FIG. 2a). A transmitter without a mixer/LO combination has many advantages in addition to reducing costs. For example, without a fixed local oscillator (s) (LO) in the frequency conversion stage(s), DC power consumption is reduced as well as cost and size. Filter requirements at the IF can be reduced and/or eliminated as well as filter requirements for the removal of LO radiation. Because a mixer is not required, spurious mixer products as well as intermodulation distortion produced by the mixer are removed, thereby improving the spurious free dynamic range and shielding requirements. Additionally, losses introduced by the mixer are removed which reduce the required channel gain and which improve the gain linearity.

By properly selecting/setting the conversion rate for the DAC 22, the transmitter according to the principles of the present invention can increase the utilization of the potential conversion bandwidth provided by the DAC 22 to transmit RF analog signals in different frequency bands separated by large frequency differences. In the above example, the entire FM radio spectrum, the B band for the cellular spectrum and the D block for the PCS spectrum were positioned in the digital domain within the conversion bandwidth of 300 MHz and converted into analog form using a single DAC having a conversion rate of 600 MHz. In converting the digital signals in the conversion bandwidth into analog signals, the DAC produces a fundamental analog image of the converted digital signals in the conversion bandwidth as well as replica and mirror images of the fundamental image which can be used for to produce analog signals at the appropriate transmission frequencies. In other embodiments, different conversion rates can be used to increase or decrease the conversion bandwidth, for example to provide extra bandwidth or guard bands between the signals of the different frequency bands.

Accordingly, the transmitter according to the principles of the present invention can transmit signals from systems using different, the same or no multiple access techniques, using the same and/or different modulation techniques, and/or using different and/or contiguous frequency bands or schemes in a single DAC converter without frequency conversion to the RF or transmit frequency bands. The analog signals can be characterized as wideband, broadband and/or narrowband. Alternative embodiments could have frequency conversion of the analog signal image(s). As such, an analog signal image could be at an intermediate frequency which requires frequency conversion. For example, an analog signal mirror or replica image could be frequency converted to radio or transmission frequency to reduce or eliminate a frequency conversion stage or to fine tune the positioning of the analog signal images at radio or transmission frequency.

In addition to the embodiment described above, alternative configurations of the transmitter architecture according to the principles of the present invention are possible which omit and/or add components and/or use variations or portions of the described transmitter architecture. For example, an AM broadcast radio frequency band (550–1600 kHz) can be added to the combined or composite digital signal, and the DAC 22 can convert the digital signals in the AM radio frequency band. The AM radio frequency band would be located in the kilohertz range of the conversion bandwidth. As such, the transmitter according to the principles of the present invention could use analog signal images from the conversion process to transmit signals from different sources simultaneously, such as the cellular or PCS networks, AM and/or FM broadcast radio stations, satellite systems, or other systems based on different physical mediums for transmission. As would be understood by one of ordinary skill in the art, the various components making up the transmitter architecture and their respective operating parameters and characteristics should be properly matched up to provide the proper operation. For example, an embodiment of the transmitter system can be used to transmit signals according to systems using different protocols and RF frequencies, such as a North American TDMA system, a Global System For Mobile Communication (GSM) system, a code division multiple access (CDMA) system, frequency division multiple access (FDMA) systems, FM radio and/or AM radio.

Additionally, the embodiments of the transmitter according to the principles of the present invention have been described as using multiple distinct analog signal images to transmit analog signals in non-contiguous frequency bands. The digital transmitter according to the principles of the present invention can use a conversion rate or digital signal frequency(ies), for example which is set dynamically, periodically, at subscription, as controlled in the field or during manufacture, to produce analog signal images for the transmission of analog signals in a particular frequency band and/or using a particular multiple access technique, for example CDMA at the cellular B band. As such, the same hardware can be used for digital transmitters which transmit analog signals at different frequencies and/or using different multiple access techniques or protocols. The desired transmission frequencies can be set at manufacture or changed periodically, dynamically or as directed or controlled by setting and/or using different conversion rates and/or digital signal frequency(ies). The desired protocol or multiple access technique can be provided via stored or downloaded software and/or transmitter reconfiguration, for example using programmable logic devices and the like, depending on the embodiment as would be understood by one of skill in the art.

In the above example, the frequency band(s) for transmission have been associated with base station transmit frequencies, but the transmitter architecture according to the principles of the present invention can be used in wireless units, such as mobile units, transmitting information at different frequency band(s), for example, transmitting on PCS and/or cellular frequencies using the same and/or different multiple access systems in attempts to gain access to one or a plurality of wireless communications systems. After gaining access to one or a plurality of the wireless communications systems, the digital transmitter could continue transmissions at one or a plurality of the wireless communications systems over the corresponding frequency band(s). As such, depending on the available coverage or capabilities of the wireless unit, a wireless unit or wireless base station could dynamically, periodically, during operation or at manufacture or installation adjust the conversion rate and/or the frequency(ies) of the digital signal(s) to properly position the analog signal image(s) for transmission in the desired band(s). This exemplifies the increased flexibility of this transmitter architecture which can provide changing and/or different operating frequency(ies) because it does not require analog frequency conversion on transmit paths which are generally fixed after manufacture and/or installation.

Furthermore, the transmitter system has been described using particular configurations of distinct components, but it should be understood that the transmitter system and portions thereof can be implemented in application specific integrated circuits, software-driven processing circuitry, firmware, programmable logic devices, hardware or other arrangements of discrete components as would be understood by one of ordinary skill in the art with the benefit of this disclosure. Although in the illustrative embodiment is shown with a particular circuitry, the transmitter architecture can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of processing digital signals to be transmitted in analog form, said method comprising:
   in a digital-to-analog converter (DAC) having a conversion frequency, converting a digital signal having an input frequency to produce an analog signal image output at a radio frequency greater than the input frequency, CHARACTERISED IN THAT:
   a) said digital signal is one of a plurality of digital input signals each of said digital input signals having an input frequency, and the input frequencies are positioned within non-overlapping portions of a frequency band whose width is one-half the conversion frequency;
   b) the analog signal image output of the DAC includes a plurality of images of the frequency band, and said plurality of images are grouped in successive non-overlapping frequency bands referred to as zones such that each zone contains one image of each of the plurality of digital input signals; and
   c) the method further comprises selecting digital input signal images for transmission, wherein at least two digital input signal images are selected from different zones and correspond to different ones of the plurality of digital input signals.

2. The method of claim 1, further comprising:
   directing each selected digital input signal image onto a respective path;
   amplifying each said selected digital input signal image on said respective path; and
   transmitting each amplified selected digital input image using at least one respective antenna.

3. The method of claim 1 further comprising:
   adjusting the conversion frequency so as to produce at leas one digital input signal image at a transmission frequency.

4. The method of claim 1 further comprising:
   adjusting at least one of the plurality of digital input frequencies so as to produce at least one digital input signal image at a transmission frequency.

5. A transmitter comprising:
   a digital to analog converter (DAC) having a conversion frequency and configured to receive a plurality of digital input signals, each having a different input frequency, and to convert each digital input signal of said plurality of digital input signals into analog form, thereby to produce corresponding digital input signal images as analog signals at different radio frequencies, each of which is greater than its corresponding input frequency;
   CHARACTERISED IN THAT the transmitter further comprises:
   signal processing circuitry configured to receive said plurality of digital input signals and to condition said digital input signals for input to the DAC by positioning their respective input frequencies in non-overlapping portions of a frequency band whose width is one-half the conversion frequency; and
   transmitter circuitry configured to select certain of said digital input signal images for transmission, wherein said digital input signal images are grouped in a plurality of non-overlapping successive frequency bands referred to as zones, such that each zone contains one digital input signal image of each digital input signal, and the transmitter circuitry is configured to select from different zones at least two digital input signal images that correspond to different ones of the plurality of digital input signals.

6. The transmitter of claim 5 wherein said transmitter circuitry comprises:
   signal distribution circuitry configured to direct a first selected digital input signal image of a first frequency band on a first path and a second selected digital input signal image of a second frequency band on a second path;
   a first amplifier on said first path for amplifying said first selected digital input signal image on said first path;
   a second amplifier on said second path for amplifying said second selected digital input signal image on said second path;
   a first antenna connected to said first path for transmitting said first selected digital input signal image after amplification; and
   a second antenna connected to said second path for transmitting said second selected digital input signal image after amplification.

* * * * *